United States Patent
Hanaoka et al.

(10) Patent No.: US 6,894,394 B2
(45) Date of Patent: May 17, 2005

(54) SEMICONDUCTOR DEVICE, CIRCUIT BOARD, ELECTRONIC APPARATUS, AND METHOD FOR MANUFACTURING SEMICONDUCTOR DEVICE

(75) Inventors: Terunao Hanaoka, Suwa (JP); Yasunori Kurosawa, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/801,110

(22) Filed: Mar. 15, 2004

(65) Prior Publication Data

US 2004/0245625 A1 Dec. 9, 2004

(30) Foreign Application Priority Data

Mar. 20, 2003 (JP) ........................................ 2003-078095
Nov. 14, 2003 (JP) ........................................ 2003-385421

(51) Int. Cl.⁷ .......................... H01L 23/48; H01L 23/52
(52) U.S. Cl. ........................ 257/773; 257/774; 257/776
(58) Field of Search .................................. 257/773, 774, 257/776

(56) References Cited

U.S. PATENT DOCUMENTS 6,177,731 B1 * 1/2001 Ishida et al. ................ 257/780
6,323,542 B1   11/2001 Hashimoto ................. 257/669

2002/0008320 A1   1/2002 Kuwabara et al. .......... 257/738

FOREIGN PATENT DOCUMENTS

| JP | 11-297873 | 10/1999 |
| JP | 2003-209137 | 7/2003 |
| WO | WO00/55898 | 9/2000 |

* cited by examiner

Primary Examiner—David Nelms
Assistant Examiner—Tu-Tu Ho
(74) Attorney, Agent, or Firm—Hogan & Hartson, LLP (57) ABSTRACT

A method for manufacturing a semiconductor device includes (a) forming electrical interconnections over a surface of a semiconductor substrate having integrated circuits, (b) providing a plurality of bonding pads disposed on the surface of the semiconductor substrate, (c) electrically connecting the electrical connections to respective bonding pads of the plurality of bonding pads, (d) electrically connecting the plurality of bonding pads to each of the integrated circuits, (e) forming resin layers so as to cover the electrical interconnections, (f) forming concave portions by a first process, each of the concave portions being disposed in a corresponding portion of the resin layers that cover the electrical interconnections, (g) curing the resin layers having the concave portion, (h) forming through-holes by removing bottoms of the concave portions by a second process that differs from the first process and (i) forming external connection terminals, each being disposed on a corresponding area of the electrical interconnections exposed through the through-holes.

20 Claims, 6 Drawing Sheets

SEMICONDUCTOR DEVICE, CIRCUIT BOARD, ELECTRONIC APPARATUS, AND METHOD FOR MANUFACTURING SEMICONDUCTOR DEVICE

BACKGROUND OF THE INVENTION

1. Field of the Invention

The present invention relates to a semiconductor device, a method for manufacturing a semiconductor device, a circuit board, and an electronic apparatus.

2. Description of the Related Art

A process for manufacturing a semiconductor device may include a step of forming resin layers, for example, solder resist layers, over electrical interconnections. Another step is forming apertures in the resin layers and a further step is forming external connection terminals, for example, solder balls on the respective electrical interconnections exposed through the apertures. Conventionally, the resin layers are cured between the step of forming the apertures in the resin layers and the step of forming the external connection terminals. This curing step causes the electrical interconnections exposed through the apertures to be passivated; for example, oxide films are formed. Consequently, an activation step, for example, a step of removing the oxide films is required.

Accordingly, an advantage of the present invention is to simplify the method by eliminating an activation step of the electrical interconnections.

SUMMARY OF THE INVENTION

A method for manufacturing a semiconductor device includes the steps of forming electrical interconnections over a surface of a semiconductor substrate, the electrical interconnections being electrically connected to respective bonding pads disposed on the surface of the semiconductor substrate including integrated circuits, a plurality of the bonding pads being electrically connected to each of the integrated circuits, forming resin layers so as to cover the electrical interconnections, forming concave portion by a first process, each of the concave portion being disposed in the corresponding portion of the resin layers that cover the respective electrical interconnections and curing the resin layers having the concave portion. The method also includes the steps of forming through-holes by removing the respective bottoms of the concave portion by a second process that differs from the first process and forming external connection terminals, each being disposed on the corresponding area of the electrical interconnections exposed through the through-holes. According to the present invention, in the step of curing the resin layers, the resin layers have the concave portion, but the electrical interconnections are not exposed; hence, passivation of the electrical interconnections can be blocked.

In this method for manufacturing a semiconductor device, the resin layers may be formed using a thermosetting resin precursor in the forming resin layers step and the thermosetting resin may be heated in the curing the resin layers step. Also, in this method for manufacturing a semiconductor device, the resin layers may be formed using a radiation-sensitive resin precursor in the forming resin layers step and the first process may involve a step of irradiating the resin precursor with radiation and a step of developing the irradiated resin precursor.

In this method for manufacturing a semiconductor device, the second process may be dry etching and each of the resin layers may be composed of solder resist.

A semiconductor device according to the present invention is manufactured by any one of methods described above A circuit board according to the present invention mounts the semiconductor device described above and an electronic apparatus according to the present invention includes the semiconductor device described above.

DETAILED DESCRIPTION OF THE PREFERRED EMBODIMENTS

The embodiments of the present invention will now be described with reference to the drawings.

First Embodiment

Figure 1:
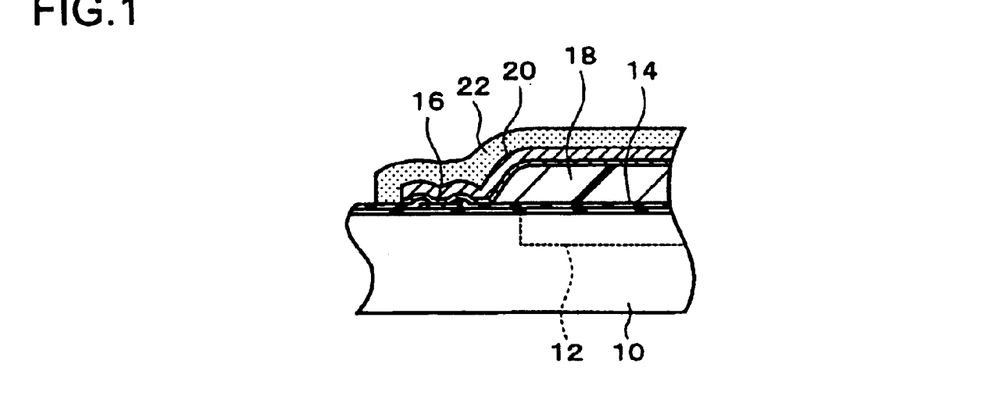
FIG. 1 illustrates a method for manufacturing a semiconductor device according to a first embodiment of the present invention.

FIGS. 1 to 5 and FIGS. 13 to 16 illustrate a method for manufacturing a semiconductor device according to a first embodiment of the present invention. In this embodiment, a semiconductor substrate 10 as shown in FIG. 1 is used. The semiconductor substrate 10 includes a plurality of integrated circuits 12. When the semiconductor substrate 10 is cut into a plurality of separated semiconductor chips, the separated semiconductor chips have the respective integrated circuits 12.

A passivation layer 14 may be formed on a surface of the semiconductor substrate 10. For example, the passivation layer 14 may be formed of an inorganic material such as silicon dioxide ($SiO_2$) or silicon nitride (SiN). The passivation layer 14 may include a plurality of sublayers. In this case, at least one sublayer (for example, the uppermost sublayer) may be formed of an organic material. The bonding pads 16 are formed on the upper surface of the semiconductor substrate 10. Bonding pads 16 are electrically connected to the integrated circuits 12 (for example, semiconductor integrated circuits). The passivation layer 14 is not disposed on at least the middle area of each of the bonding pads 16.

Stress relieving layers 18 may be formed on the semiconductor substrate 10. The stress relieving layers 18 may be formed on the semiconductor substrate 10 by applying or spin-coating a resin precursor, for example, a thermosetting resin precursor. Each of the stress relieving layers 18 may include a plurality of sublayers or a single layer. The stress relieving layers 18 are electrical insulators. The stress relieving layers 18 may be formed of, for example, a polyimide resin, a silicone-modified polyimide resin, an epoxy resin, a silicone-modified epoxy resin, a benzocyclobutene (BCB), or polybenzoxazole (PBO). The stress relieving layers 18 cannot contain electrically conductive particles. The stress relieving layers 18 may be formed of a light shielding material.

The stress relieving layers 18 may be formed of a radiation-sensitive resin precursor that is sensitive to radiation such as light (ultraviolet light and visible light), X-rays, and an electron beam. The radiation-sensitive resin precursor such as a photosensitive resin precursor includes a negative type in which a radiation exposed area of the resin precursor becomes insoluble and a positive type in which a radiation exposed area of the resin precursor has increased solubility.

The stress relieving layers 18 need not be disposed on the respective bonding pads 16. The stress relieving layers 18 need not be disposed on areas for cutting the semiconductor substrate 10. The stress relieving layers 18 may be formed by patterning after the resin precursor layer is continuously or integrally formed with the semiconductor substrate 10. The stress relieving layers 18 may be formed on the respective areas (each of the areas having the corresponding integrated circuit 12) on the semiconductor substrate 10. Spaces are provided between adjacent stress relieving layers 18.

Electrical interconnections 20 are formed on the respective stress relieving layers 18. The electrical interconnections 20 may be formed of a single layer or multiple layers. For example, a titanium tungsten (TiW) layer and a copper (Cu) layer are laminated by sputtering, and then a Cu layer may be further formed on the laminated layers by plating. Known methods can be applied for forming the electrical interconnections 20. Each of the electrical interconnections 20 extends over the corresponding bonding pads 16, in other words, is electrically connected to the corresponding bonding pad 16. Each of the electrical interconnections 20 extends over the corresponding bonding pad 16 and the corresponding stress relieving layer 18. The electrical interconnections 20 may have respective lands which have a width greater than that of the electrical interconnections. The lands are areas to provide respective external connection terminals 28.

Resin layers 22 are formed on the stress relieving layers 18. In this embodiment, the resin layers 22 include both uncured (unpolymerized resin precursor) layers and cured (polymerized resin) layers. Each of the resin layers 22 is formed of a solder resist. The resin layers 22 cover, for example, the entity of the respective electrical interconnections 20. The resin layers 22 may be formed so as to cover, for example, the entity of the respective stress relieving layers 18. The resin layers 22 may be disposed so that areas for cutting the semiconductor substrate 10 are exposed, in other words, the resin layers 22 need not be disposed on areas for cutting the semiconductor substrate 10. The resin layers 22 cannot contain electrically conductive particles. The resin layers 22 may be formed of a light shielding material. The resin layers 22 may be formed by patterning after a resin precursor layer is continuously or integrally formed with the semiconductor substrate 10. The resin layers 22 may be formed on the respective areas (each of the plurality of areas having the corresponding integrated circuit 12) on the semiconductor substrate 10. Spaces are provided between adjacent resin layers 22.

The resin layers 22 may be formed of a radiation-sensitive resin precursor that is sensitive to radiation, for example, light (ultraviolet light and visible light), X-rays, or an electron beam.

Figure 2:
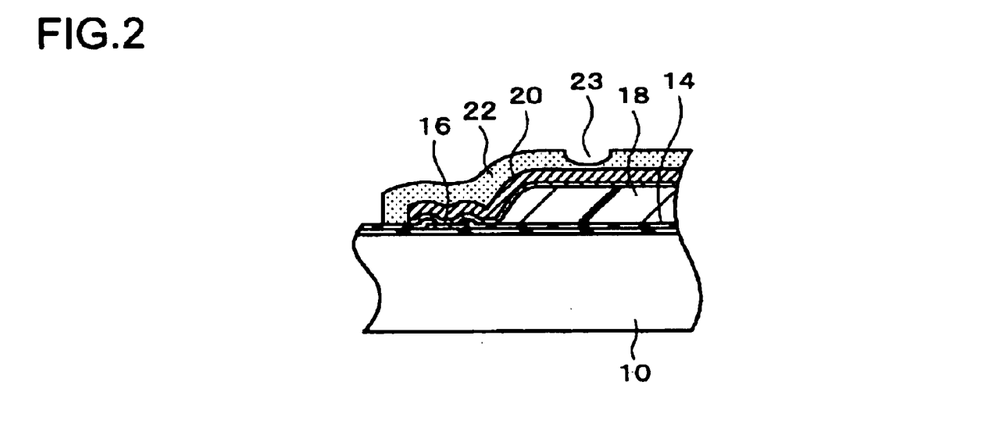
FIG. 2 illustrates the method for manufacturing a semiconductor device according to the first embodiment of the present invention.

As shown in FIG. 2, concave portions 23 (first concave portions) are formed in the resin layers 22. Each of the concave portions 23 is formed in a corresponding portion of the resin layers 22 overlapped with the respective electrical interconnections 20, for example, lands. The concave portions 23 are formed by a first process. The first process may include lithography. For example, the resin layers 22 may be formed of a radiation-sensitive resin precursor and then by patterning (for example, developing) with radiation. The radiation-sensitive resin precursor such as a photosensitive resin precursor includes a negative type in which an area of the resin precursor exposed to radiation (for example, light) becomes insoluble and a positive type in which an area of the resin precursor exposed to radiation (for example, light) has increased solubility. Each of the concave portions 23 may have a width that decreases with the depth. The inner surfaces of the concave portions 23 need not have sharp edges. The concave portions 23 may have gently curved inner surfaces.

Figure 13:
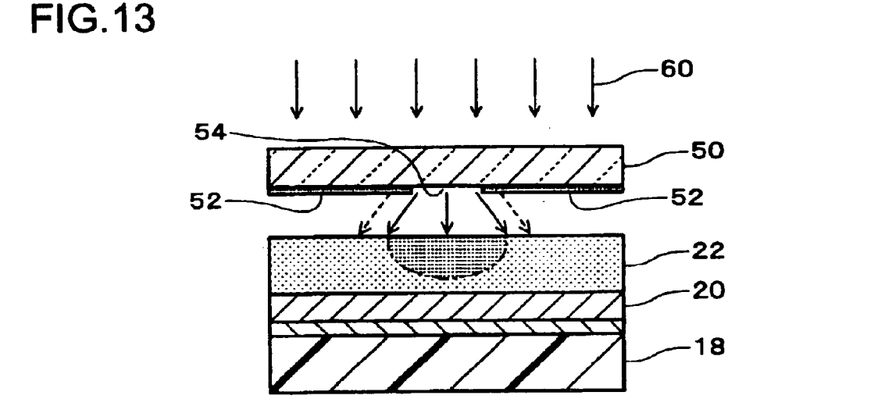
FIG. 13 illustrates the method for manufacturing a semiconductor device according to the first embodiment of the present invention.

A first process for forming the concave portions 23 will now be described in detail. In examples shown in FIGS. 13 and 14, the concave portions 23 are formed by decreasing an irradiation dosage (for example, shortening of the irradiation time and/or decreasing the intensity of light) in an exposure step. As shown in FIG. 13, a mask 50 is disposed above the resin layers 22, and then the resin layers 22 are irradiated with radiation 60 through the mask 50. In this embodiment, a positive type radiation-sensitive resin precursor is used as an example. The mask 50 has a shielding area 52 blocking the radiation 60 and transparent areas 54 that transmit the radiation 60. The mask 50 includes a glass-based material. Hence, the resin layers 22 may be irradiated with the radiation 60 through the glass-based material.

Figure 14:
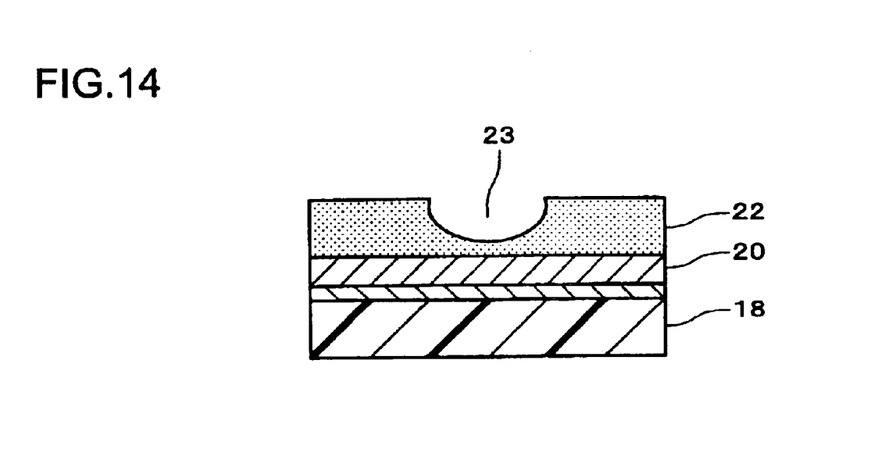
FIG. 14 illustrates the method for manufacturing a semiconductor device according to the first embodiment of the present invention.

In this step, the irradiation dosage of the radiation 60 is less than that of the conventional case (for example, in the case of forming apertures that have walls perpendicular to the semiconductor substrate in the resin layers 22). Thus, the radiation 60 cannot reach the bottoms, which are in contact with the electrical interconnections 20, of the resin layers 22. The radiation 60 is not only perpendicularly incident on the resin layers 22 but also obliquely incident. The radiation 60 is perpendicularly incident on the resin layers 22 corresponding to the pattern of the mask 50 (i.e., corresponding to the transparent areas 54). The radiation 60 is deflected at boundaries of the shielding area 52 and the transparent areas 54, whereby the deflected radiation 60 is obliquely incident on the resin layers 22. Consequently, in the vicinities of portions located directly below the respective transparent area 54, the radiation 60 that is incident on the resin layers 22 gradually decreases in intensity away from each of the centers of the portions located directly below the respective transparent areas 54; hence, the depth of the radiation 60 that is incident on the resin layers also gradually decreases away from each of the centers of the portions located directly below the respective transparent areas 54. In this way, concave shaped portions having increased solubility can be formed in the respective resin layers 22 by being irradiated with the radiation 60. Subsequently, the concave portions having increased solubility in the resin layers 22 are dissolved and removed by developing, whereby the concave portions 23 can be formed as shown in FIG. 14.

Figure 15:
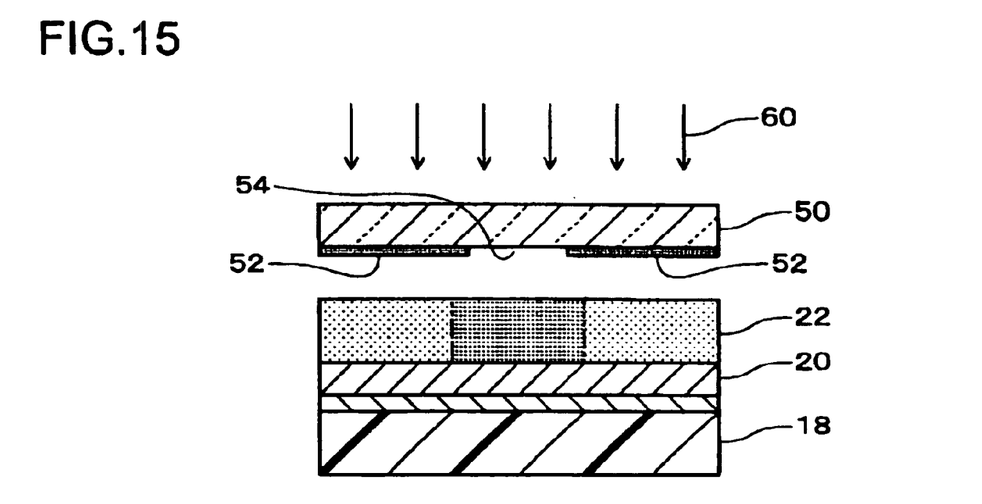
FIG. 15 illustrates the method for manufacturing a modification of a semiconductor device according to the first embodiment of the present invention.
Figure 16:
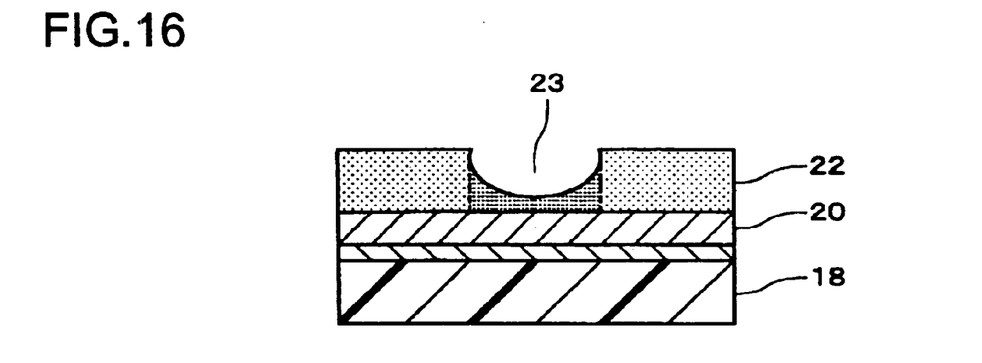
FIG. 16 illustrates the method for manufacturing a modification of a semiconductor device according to the first embodiment of the present invention.

In a modification of the first process for forming the concave portions 23 shown in FIGS. 15 and 16, in a developing step, the concave portions 23 are formed by a decreased amount of dissolved resin layer by development (for example, by decreasing the developing time and/or decreasing the developer concentration). An exposure step is performed as shown in FIG. 15. The description given in the above-mentioned embodiment (see FIG. 13) is also applicable to this step. In this modification, the resin layers are sufficiently irradiated with the radiation 60 (for example, the degree to which the apertures having walls perpendicular to the semiconductor substrate in the resin layers 22 can be formed). Thus, the radiation 60 reaches the bottoms, which are in contact with the electrical interconnections 20, of the resin layers 22. The radiation 60 is incident on the portions of the resin layers 22, each of the portions being located directly below the corresponding transparent area 54. As shown in FIG. 15, the radiation 60 may be obliquely incident on the resin layers 22, so that the radiation 60 is incident on the portions having a width greater than that of the corresponding transparent areas 54. Subsequently, the portions having increased solubility in the resin layers 22 are dissolved by developing. In this modification, the amount of dissolved resin layers 22 by developing decreases; hence, as shown in FIG. 16, only part of each of the portions having increased solubility in the corresponding resin layers 22 can be removed. Developer penetrates into each of the resin layers 22 through the corresponding upper surface, which is opposite to the electrical interconnections 20, of the resin layer 22. The penetration depth gradually decreases away from each of the centers of the portions having increased solubility. In this way, as shown in FIG. 16, the concave portions 23 can be formed.

Furthermore, even when typical steps of exposing and developing are performed, resin residue often remains in the apertures. In this case, each of the apertures in the resin layers 22 cannot have a wall perpendicular to the semiconductor substrate in the corresponding resin layer 22. The thickness of the resin residue increases away from each of the centers of the apertures. The concave portions 23 may be formed by the resin residue.

Figure 3:
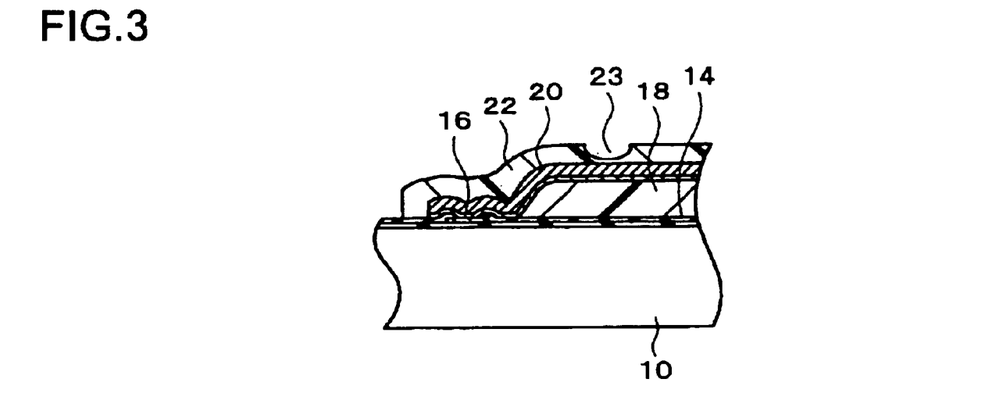
FIG. 3 illustrates the method for manufacturing a semiconductor device according to the first embodiment of the present invention.

As shown in FIG. 3, the resin layers 22 are cured. The step of curing the resin layers 22 may cause the electrical interconnections 20 to be passivated. (For example, the oxide film is formed on the surface of the electrical interconnections 20.) For example, when the resin layers 22 are formed of a thermosetting resin precursor, the thermosetting resin precursor is cured (polymerized) by heating. In this embodiment, when the resin layers 22 are cured, the resin layers 22 have the concave portions 23, but the electrical interconnections 20 are not exposed; hence, the electrical interconnections 20 do not undergo passivation. Accordingly, the method can be simplified by eliminating an activation step of the electrical interconnections 20.

Figure 4:
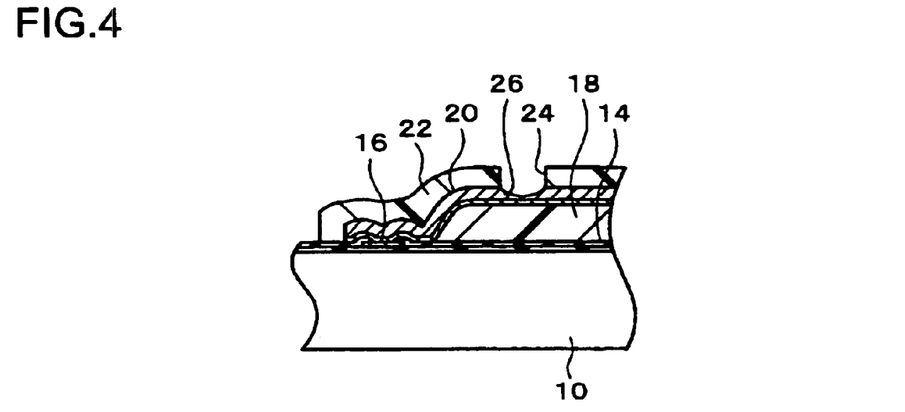
FIG. 4 illustrates the method for manufacturing a semiconductor device according to the first embodiment of the present invention.

As shown in FIG. 4, through-holes 24 are formed in the resin layers 22. The through-holes 24 are formed after the resin layers 22 are cured. The through-holes 24 are formed by removing the bottoms of the concave portions 23. The through-holes 24 are formed by a second process. The second process differs from the first process for forming the concave portions 23. The second process may be, for example, dry etching.

The concave portions 26 (second concave portions) may be formed in the electrical interconnections 20. Each of the concave portions 26 may be overlapped with the corresponding through-holes 24. Each of the apertures of the concave portions 26 may be entirely included within the corresponding through-hole 24. The concave portions 26 may be formed by, for example, dry etching. The process for forming the concave portions 26 may be the same as the process for forming the through-holes 24. After the through-holes 24 are formed, the concave portions 26 may be subsequently formed. Each of the concave portions 26 may have a width that decreases with the depth. The inner surfaces of the concave portions 26 need not have sharp edges. The concave portions 26 may have gently curved inner surfaces.

Figure 5:
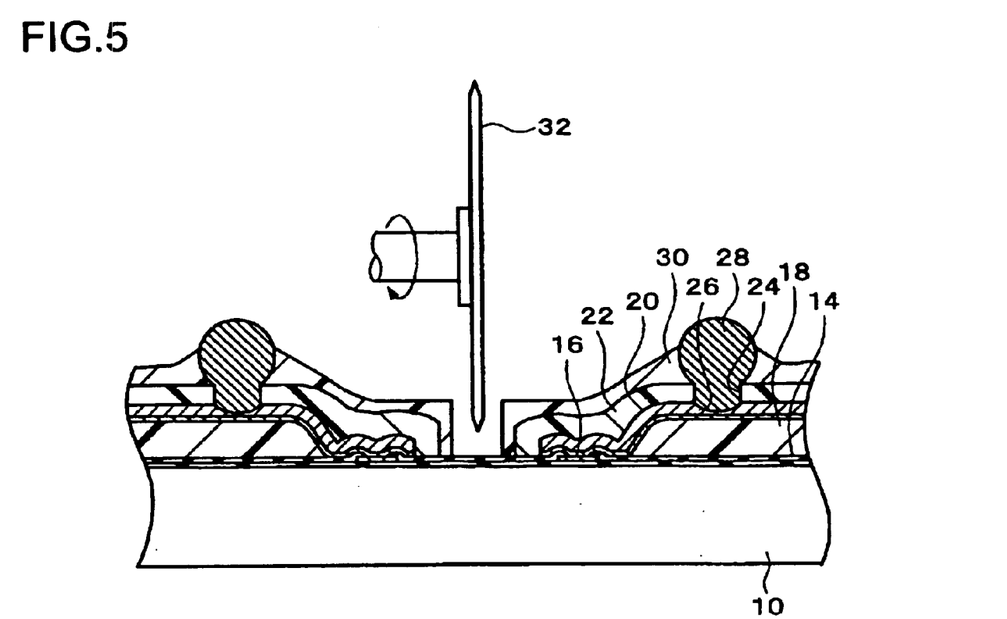
FIG. 5 illustrates the method for manufacturing a semiconductor device according to the first embodiment of the present invention.

As shown in FIG. 5, the external connection terminals 28 are formed. The external connection terminals 28 are formed on the respective areas of the electrical interconnections 20 exposed through the through-holes 24 (for example, the concave portions 26). The external connection terminals 28 are bonded to the respective electrical interconnections 20, for example, the concave portions 26 of the electrical interconnections 20. The external connection terminals 28 may be in contact with the respective inner faces of the through-holes 24 in the resin layers 22. The external connection terminals 28 may be composed of either soft solder or hard solder. Lead-free solder may be used for the soft solder. Lead-free solder such as tin-silver (Sn—Ag), tin-bismuth (Sn—Bi), tin-zinc (Sn—Zn), and tin-copper (Sn—Cu) based alloys may be used. These alloys may further contain at least one of silver, bismuth, zinc, and copper. A known method can be applied to form the external connection terminals 28.

As shown in FIG. 5, second resin layers 30 may be formed on the respective resin layers 22. The description of the stress relieving layers 18 given above may also be applied to the second resin layers 30. Each of the second resin layers 30 is formed so as to surround the corresponding plurality of external connection terminals 28. Each of the second resin layers 30 may cover a part (for example, the base portion) of the external connection terminals 28. The second resin layers 30 may be formed so as to cover, for example, the entire respective resin layers 22. The second resin layers 30 may be formed by patterning a solid resin layer that is formed so as to cover the entire semiconductor substrate 10. Alternatively, the second resin layers 30 may be formed of a solid resin layer on the entity of the external connection terminals 28 and then by removing the solid resin layer at the top ends of the external connection terminals 28. The description of the patterning for the stress relieving layers 18 given above is also applicable to the patterning for the second resin layers 30. Alternatively, parts of the second resin layers 30 may be removed by laser irradiation or ashing.

A semiconductor wafer according to an embodiment of the present invention includes the semiconductor substrate 10. The semiconductor substrate 10 includes a plurality of the integrated circuits 12 (see FIG. 1) and bonding pads 16 on a surface of the semiconductor substrate. Each of the bonding pads 16 is electrically connected to the corresponding integrated circuit 12. The electrical interconnections 20 are electrically connected to the respective bonding pads 16. The resin layers 22 are formed on the electrical interconnections 20. The external connection terminals 28 are formed on the respective electrical interconnections 20. The second resin layers 30 may surround the external connection terminals 28.

The resin layers 22 have through-holes 24. The electrical interconnections 20 may have respective concave portions 26. Each of the concave portions 26 may be overlapped with corresponding through-hole 24. Each of the apertures of the concave portions 26 may be entirely included within the corresponding through-hole 24. The external connection terminals 28 may be in contact with the respective inner faces of the through-holes 24 in the resin layers 22.

In this embodiment, the external connection terminals 28 are bonded to the respective concave portions 26, whereby the bonding strength between the electrical interconnections 20 and the external connection terminals 28 can be improved by the concave portions 26. Furthermore, contact areas between the electrical interconnections 20 and the external connection terminals 28 increase by forming the concave portions 26; hence, the electrical connection performance between the electrical interconnections 20 and the external connection terminals 28 is improved. Other details are the same as described above.

As shown in FIG. 5, the semiconductor substrate 10 is cut by, for example, scribing or dicing with, for example, a cutter (or blade) 32. In this way, semiconductor devices can be obtained.

Figure 6:
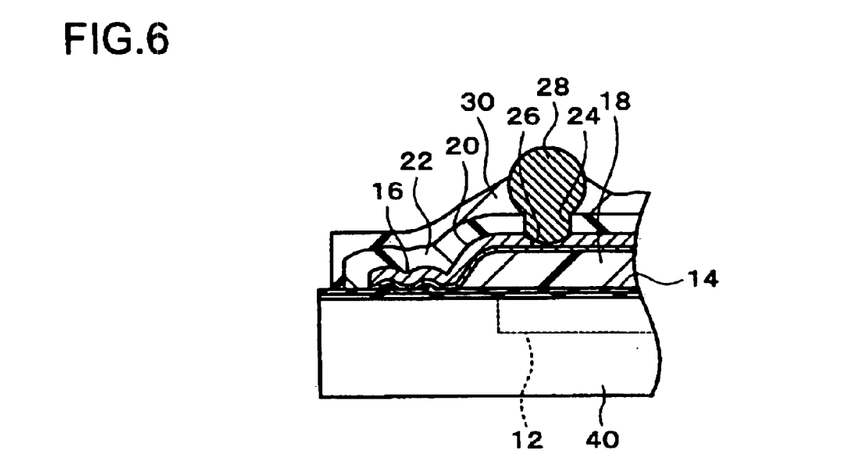
FIG. 6 is an enlarged partial cross-sectional view taken along the line VII—VII in FIG. 7.
Figure 7:
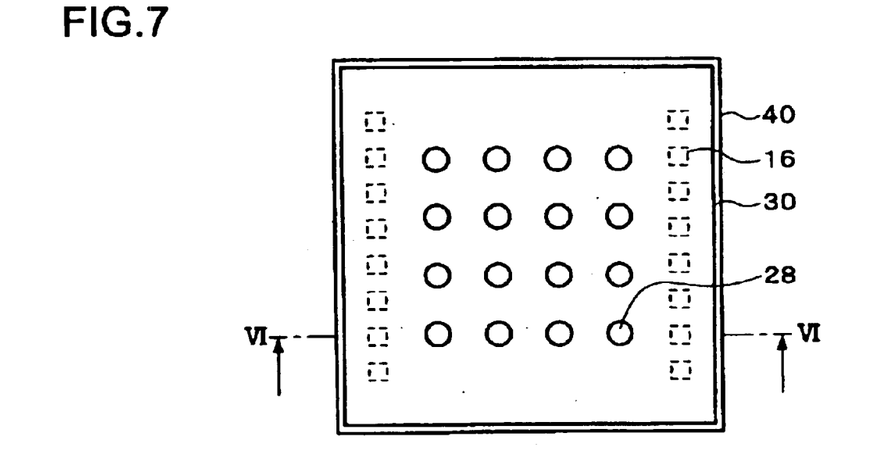
FIG. 7 illustrates a semiconductor device according to the first embodiment of the present invention.

FIGS. 6 and 7 illustrate a semiconductor device according to this embodiment. FIG. 6 is a cross-sectional view taken along the line VI—VI in FIG. 7. The semiconductor device has a semiconductor chip 40. The semiconductor chip 40 may be cut from the semiconductor substrate 10. Other details of the semiconductor device are the same as the descriptions of the semiconductor wafer.

Second Embodiment

Figure 8:
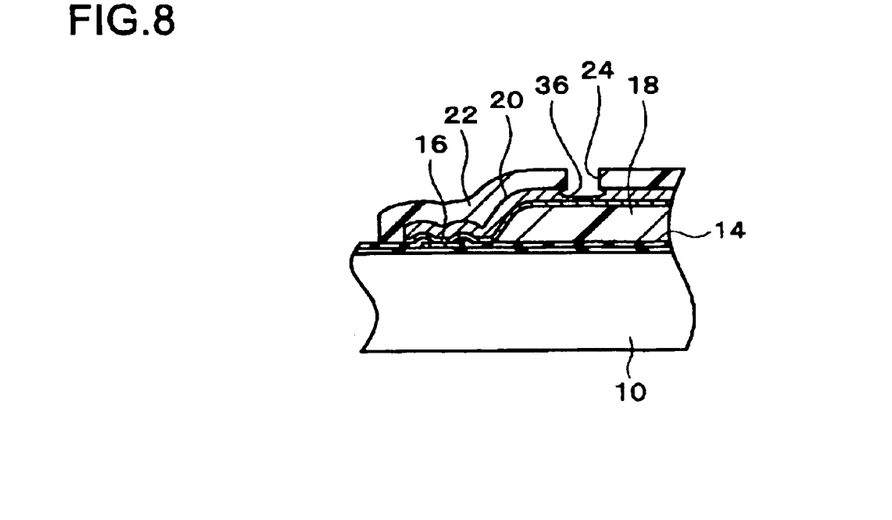
FIG. 8 illustrates a method for manufacturing a semiconductor device according to a second embodiment of the present invention.

FIG. 8 illustrates a method for manufacturing a semiconductor device according to a second embodiment of the present invention. In this embodiment, concave portions 36 that are formed in the respective electrical interconnections 20 have a different shape from the concave portions 26 in the first embodiment. Each of the concave portions 36 includes a portion having a width greater than that of the corresponding aperture at the bottom thereof. Each of the concave portions 36 has first and second widths at first and second positions, respectively, with the first width having a width greater than that of an aperture of the same concave hole at the first position and the second width having a width less than that of an aperture of the same concave hole at the second position. The first position is located at a position above that of the second position. The concave portions 36 having this shape are formed by isotropic-etching of the respective electrical interconnections 20. For example, each of the through-holes 24 is formed in the corresponding resin layer 22, and then the concave portions 36 may be formed by wet etching. Other details are the same as the descriptions of the first embodiment.

Figure 9:
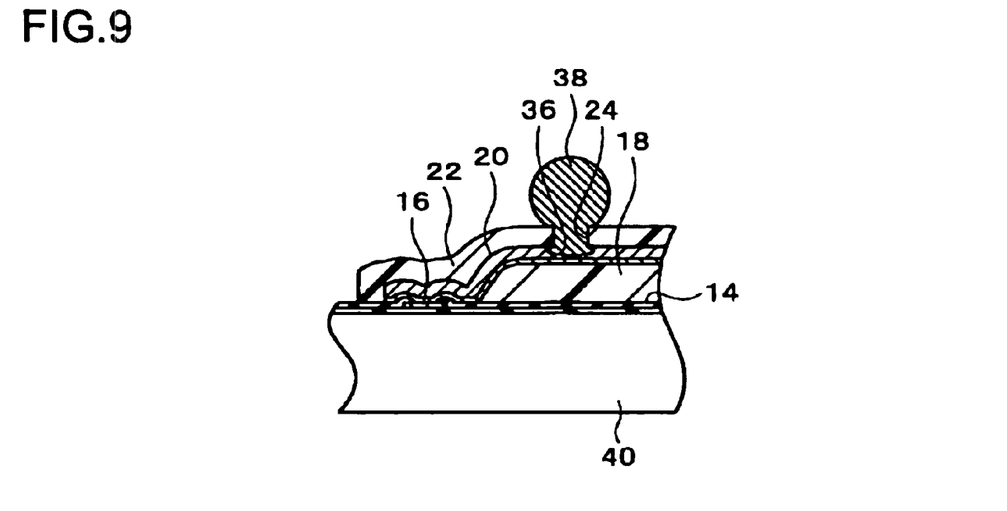
FIG. 9 illustrates a semiconductor device according to the second embodiment of the present invention.

FIG. 9 illustrates a semiconductor device according to the second embodiment of the present invention. The semiconductor device may be manufactured with a semiconductor wafer shown in FIG. 8. In this embodiment, external connection terminals 38 are bonded to the respective concave portions 36 formed in the electrical interconnections 20. Accordingly, the bonding strength between the electrical interconnections 20 and external connection terminals 38 is improved with the concave portions 36. Furthermore, contact areas between the electrical interconnections 20 and the external connection terminals 38 increase by forming the concave portions 36; hence, the electrical connection performance between the electrical interconnections 20 and external connection terminals 38 is improved. Other details are the same as the descriptions of the first embodiment.

Figure 10:
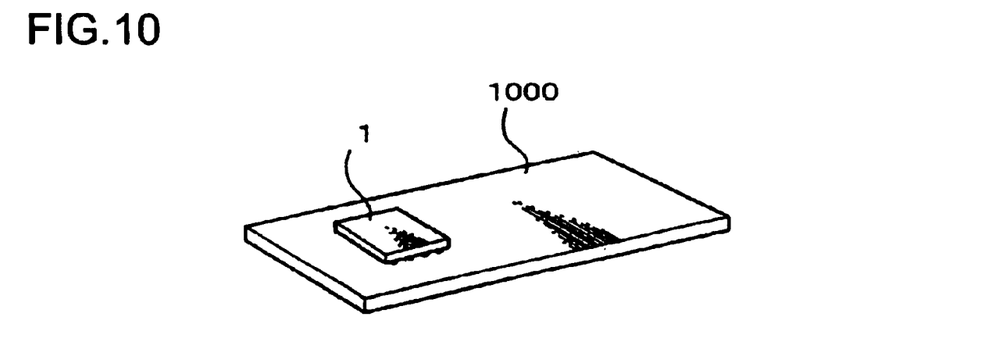
FIG. 10 illustrates a circuit board on which a semiconductor device according to an embodiment of the present invention is mounted.
Figure 11:
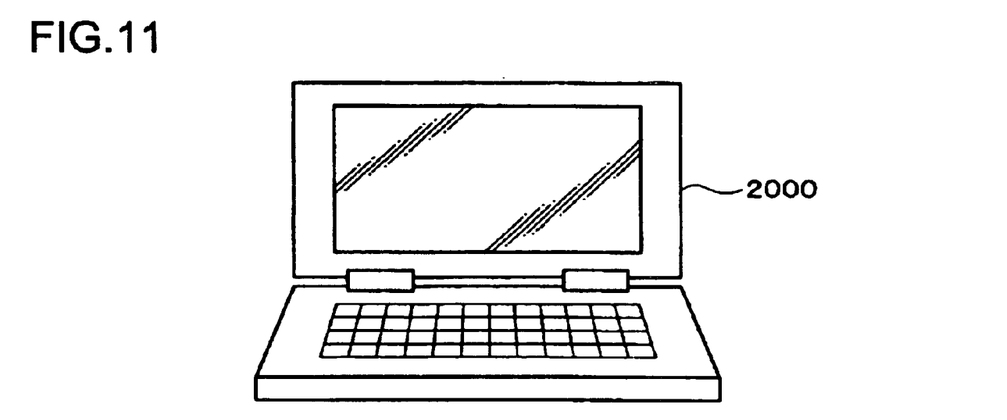
FIG. 11 illustrates an electronic apparatus including a semiconductor device according to an embodiment of the present invention.
Figure 12:
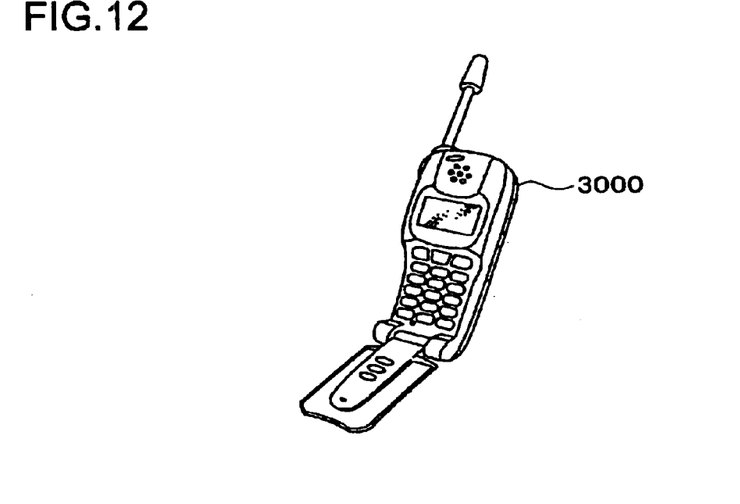
FIG. 12 illustrates an electronic apparatus including a semiconductor device according to an embodiment of the present invention.

FIG. 10 illustrates a circuit board 1000 on which the semiconductor device 1 described in the above-mentioned embodiment is mounted. FIGS. 11 and 12 illustrate a notebook personal computer 2000 and a cellular phone 3000 as electronic apparatuses including this semiconductor device.

The present invention is not limited to above-mentioned embodiments and can include a variety of modifications. For example, the present invention includes a structure which is substantially equivalent to the structure described in the embodiments. The substantially equivalent structure is, for example, a structure that has the same function, method, and result, or the same advantage and result. Further, the present invention includes a structure in which an extrinsic part of the structure described in the embodiments is replaced. Furthermore, the present invention includes a structure that has the same effect or can achieve the same advantage as the structure described in the embodiments. In addition, the present invention includes a structure according to one of the above embodiments in combination with known art.

What is claimed is:

1. A method for manufacturing a semiconductor device, comprising:

(a) forming electrical interconnections over a surface of a semiconductor substrate having integrated circuits;

(b) providing a plurality of bonding pads disposed on the surface of the semiconductor substrate;

(c) electrically connecting the electrical connections to respective bonding pads of the plurality of bonding pads;

(d) electrically connecting the plurality of bonding pads to each of the integrated circuits;

(e) forming resin layers so as to cover the electrical interconnections;

(f) forming concave portions by a first process, each of the concave portions being disposed in a corresponding portion of the resin layers that cover the electrical interconnections;

(g) curing the resin layers having the concave portion;

(h) forming through-holes by removing bottoms of the concave portions by a second process that differs from the first process; and (i) forming external connection terminals, each being disposed on a corresponding area of the electrical interconnections exposed through the through-holes.

2. The method for manufacturing a semiconductor device according to claim 1, further comprising forming the resin layers using a thermosetting resin precursor in step (e); and the thermosetting resin is heated in step (g).

3. The method for manufacturing a semiconductor device according to claim 1, further comprising forming the resin layers using a radiation-sensitive resin precursor in step (e); and the first process involves a step of irradiating the resin precursor with radiation and a step of developing the irradiated resin precursor.

4. The method for manufacturing a semiconductor device according to claim 1, further comprising dry etching in the second process.

5. The method for manufacturing a semiconductor device according to claim 1, further comprising composing each of the resin layers of solder resist.

6. A semiconductor device manufactured by a method according to claim 1.

7. A circuit board on which a semiconductor device according to claim 6 is mounted.

8. An electronic apparatus comprising a semiconductor device according to claim 6.

9. A semiconductor wafer, comprising:
a semiconductor substrate including a plurality of integrated circuits and a plurality of bonding pads provided on a surface of the semiconductor substrate, with the plurality of bonding pads being electrically connected to the plurality of integrated circuits;
electrical interconnections formed over the surface of the semiconductor substrate and electrically connected to respective bonding pads of the plurality of bonding pads;
resin layers covering the electrical interconnections;
concave portions formed by a first process with each of the concave portions being disposed in a corresponding portion of the resin layers that cover the electrical interconnections;
through-holes formed by removing bottoms of the concave portions by a second process that differs from the first process; and
external connection terminals disposed on a corresponding area of the electrical interconnections exposed through the through-holes.

10. The semiconductor wafer according to claim 9, wherein the resin layers are formed using a thermosetting resin precursor, wherein the thermosetting resin is heated.

11. The semiconductor wafer according to claim 9, wherein the resin layers are formed using a radiation-sensitive resin precursor.

12. The semiconductor wafer according to claim 9, wherein the first process involves irradiating the resin precursor with radiation and developing the irradiated resin precursor.

13. The semiconductor wafer according to claim 9, wherein the second process is dry etching.

14. The semiconductor wafer according to claim 9, wherein each of the resin layers is composed of solder resist.

15. The method for manufacturing a semiconductor device according to claim 1, further comprising forming a passivation layer of an inorganic material selected from the group consisting of silicon dioxide and silicon nitride.

16. The method for manufacturing a semiconductor device according to claim 1, further comprising forming the bonding pads on an upper surface of the semiconductor substrate.

17. The method for manufacturing a semiconductor device according to claim 1, further comprising forming a stress relieving layer on the semiconductor substrate by applying a resin precursor.

18. A semiconductor wafer, comprising:
a semiconductor substrate including a plurality of integrated circuits and a plurality of bonding pads provided on a surface of the semiconductor substrate, with the plurality of bonding pads being electrically connected to the plurality of integrated circuits;
electrical interconnections formed over the surface of the semiconductor substrate and electrically connected to respective bonding pads of the plurality of bonding pads;
means for covering the electrical interconnections;
concave portions formed by a first process with each of the concave portions being disposed in a corresponding portion of the means for covering that cover the electrical interconnections;
through-holes formed by removing bottoms of the concave portions by a second process that differs from the first process; and
external connection terminals disposed on a corresponding area of the electrical interconnections exposed through the through-holes.

19. The semiconductor wafer according to claim 18, wherein the means for covering are formed using a thermosetting resin precursor, wherein the thermosetting resin is heated.

20. The semiconductor wafer according to claim 18, wherein the means for covering are formed using a radiation-sensitive resin precursor.

* * * * *